United States Patent
Reinmuth et al.

(10) Patent No.: US 10,836,631 B2
(45) Date of Patent: Nov. 17, 2020

(54) METHOD FOR CLOSING OFF A MICROMECHANICAL DEVICE BY LASER MELTING, AND MICROMECHANICAL DEVICE HAVING A LASER MELT CLOSURE

(71) Applicant: Robert Bosch GmbH, Stuttgart (DE)

(72) Inventors: Jochen Reinmuth, Reutlingen (DE); Martin Rambach, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/113,620

(22) Filed: Aug. 27, 2018

(65) Prior Publication Data

US 2019/0071307 A1 Mar. 7, 2019

(30) Foreign Application Priority Data

Sep. 5, 2017 (DE) .................. 10 2017 215 531

(51) Int. Cl.
| | | |
|---|---|---|
| *B81C 1/00* | (2006.01) | |
| *B23K 33/00* | (2006.01) | |
| *B23K 26/354* | (2014.01) | |
| *B23K 26/20* | (2014.01) | |
| *B81B 7/00* | (2006.01) | |
| *B23K 101/36* | (2006.01) | |

(52) U.S. Cl.
CPC ........ *B81C 1/00325* (2013.01); *B23K 26/206* (2013.01); *B23K 26/354* (2015.10); *B23K 33/00* (2013.01); *B81B 7/0051* (2013.01); *B81C 1/00293* (2013.01); *B23K 2101/36* (2018.08); *B81C 2203/019* (2013.01); *B81C 2203/0145* (2013.01)

(58) Field of Classification Search
CPC .................................................. B81C 1/00325
USPC ........................................................ 257/415
See application file for complete search history.

(56) References Cited

U.S. PATENT DOCUMENTS

| | | | | |
|---|---|---|---|---|
| 2011/0114840 A1* | 5/2011 | Yannazaki | ............... | G01J 5/04 250/338.1 |
| 2011/0284912 A1* | 11/2011 | Sekine | .................. | H01L 23/481 257/99 |
| 2015/0219517 A1* | 8/2015 | Nguyen | ................ | G01L 19/145 277/650 |

(Continued)

FOREIGN PATENT DOCUMENTS

DE 102014202801 A1 8/2015

*Primary Examiner* — Ajay Arora
(74) *Attorney, Agent, or Firm* — Norton Rose Fulbright US LLP; Gerard Messina

(57) ABSTRACT

A method is described for closing off a micromechanical device by laser melting, having the steps: (A) providing a micromechanical device having an access channel that has a collar at an external opening; (B) closing off the external opening of the access channel by laser irradiation of the collar, the collar being at least partly melted and the external opening being closed with melt made of a material of the collar. Also described is a micromechanical device having a laser melt closure, in particular produced by the method according to the present invention, the micromechanical device having an access channel that has a collar at an external opening, the external opening of the access channel being closed by a melt closure made of a material of the collar.

9 Claims, 11 Drawing Sheets

(56) References Cited

U.S. PATENT DOCUMENTS

2016/0138921 A1* 5/2016 Takizawa ........... G01C 19/5712
  73/488
2016/0368763 A1* 12/2016 Gonska ..................... B81B 7/02

* cited by examiner

METHOD FOR CLOSING OFF A MICROMECHANICAL DEVICE BY LASER MELTING, AND MICROMECHANICAL DEVICE HAVING A LASER MELT CLOSURE

FIELD OF THE INVENTION

The present invention relates to a method for closing off a micromechanical device using laser melting, and to a micromechanical device having a laser melt closure.

BACKGROUND INFORMATION

MEMS elements are frequently made up of a sensor element protected from environmental influences by a cap. This is necessary for several reasons. Frequently, the sensor element functions only within a particular pressure range. Using the cap, the ambient pressure of the sensor element is set and enclosed, and a (slight) variation of the pressure within the specified limits is ensured over the useful life of the component. In order to set the required pressure inside the sensor cavern of the sensor element, various methods are possible. For example, the pressure can be set during the bonding process between the sensor wafer and the cap wafer. Alternatively, in each sensor cavern an access hole to the surrounding environment can be realized that is closed at a defined pressure by a laser method. This method has many advantages, in particular with regard to the distribution of pressure over the wafer and the precision of the setting of the pressure. Such a method is known from the German Published Patent Application No. 102014202801.9.

After or during the actual laser melting, cracks may form in the area of the closure. If this causes the cavern to become untight, this poses a risk to the proper functioning of the MEMS element.

SUMMARY

An object of the present invention is to provide a micromechanical device having a mechanically robust closure.

The present invention relates to a method for closing off a micromechanical device by laser melting, having the steps:

(A) providing a micromechanical device having an access channel that has a collar at an external opening;

(B) closing off the external opening of the access channel by laser irradiation of the collar, the collar being at least partly melted and the external opening being closed by melt made of a material of the collar.

An advantageous embodiment of the method according to the present invention provides that in step (A) a micromechanical device is provided having an external main surface, the collar being situated in a recess in the external main surface, in particular in such a way that the collar, with the external opening of the access channel, is disposed so as to be countersunk in relation to the external main surface.

An advantageous embodiment of the method according to the present invention provides that in step (A) a micromechanical device is provided, the collar having a substructuring made by at least one trench that is disposed in annular fashion around the external opening and extends parallel to the access channel.

An advantageous embodiment of the method according to the present invention provides that in step (A) a micromechanical device is provided, the collar having a substructuring made by blind holes that extend parallel to the access channel, and that have in particular a square cross-section.

An advantageous embodiment of the method according to the present invention provides that before step (A) the access channel, or also the recess, or also the collar, is produced at least partly by laser drilling.

An advantageous embodiment of the method according to the present invention provides that before step (A) the recess, or also the collar, or also the substructuring, is produced at least partly by dry etching.

The present invention also relates to a micromechanical device having a laser melt closure, in particular produced by the method according to the present invention, the micromechanical device having an access channel that has a collar at an external opening, the external opening of the access channel being closed by a melt closure made of a material of the collar.

An advantageous embodiment of the micromechanical device according to the present invention provides that the micromechanical device has a recess in an external main surface, and the collar is situated in the recess, in particular in such a way that the collar, with the external opening of the access channel, is disposed so as to be countersunk in relation to the external main surface.

The core of the present invention is a modified design of the geometry of the closure region used for the laser closure, in that a collar is situated at the external opening of the access channel. In this way, it is possible to replace previous geometries that were susceptible to cracks, and also to open up new applications. In particular, a relocation of the laser closure into a recess, such as in particular a laser cavern, underneath the main surface enables a minimization of the rate of failure caused by damage to the laser closure during the further processing of the MEMS wafer. In addition, the relocation can be done into very deep recesses, in particular laser caverns, so that removal methods such as CMP can be used to reduce the wafer thickness even after the laser closure.

Advantageously, the present invention can be used for many different MEMS, in particular sensors. These include, inter alia, acceleration sensors, rotational rate sensors, combined elements having acceleration and rotational rate sensors on a chip, and also other new types of sensors and other MEMS that require a defined setting of the cavern pressure.

In addition, the present invention can also be used to close access holes that are used to introduce materials into the cavern. These can be for example materials for coating or for etching.

BRIEF DESCRIPTION OF THE DRAWINGS

FIGS. 5 c and d show an exemplary embodiment of the micromechanical device according to the present invention having a laser melt closure, having a thick wall thickness of the directly surrounding material.

FIGS. 6 *c* and *d* show an exemplary embodiment of the micromechanical device according to the present invention having a laser melt closure, having a small hole diameter relative to the wall thickness of the directly surrounding material.

FIGS. 7 *c* and *d* show an exemplary embodiment of the micromechanical device according to the present invention, having a laser melt closure having an annular substructuring of the directly surrounding material that has different depths.

FIGS. 7 *e* and *f* show an exemplary embodiment of the micromechanical device according to the present invention having a laser melt closure, having a local substructuring of the directly surrounding material, having blind holes that have a square cross-section.

DETAILED DESCRIPTION

Figure 1:
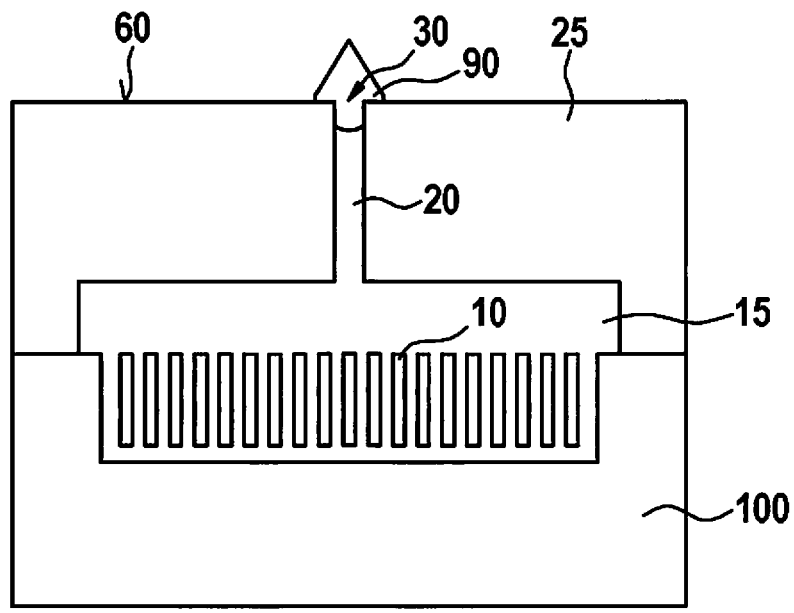
FIG. 1 shows a first micromechanical device having a laser melt closure from the existing art.

FIG. 1 shows a first micromechanical device having a laser melt closure from the existing art. Shown is a micromechanical device having a cavern 15 essentially enclosed by a MEMS wafer 100 and a cap 25. A micromechanical functional element 10 is situated in cavern 15. The micromechanical device has an access channel 20 that forms an access from an external surrounding environment to cavern 15. For this purpose, access channel 20 ends in an external main surface 60 of the micromechanical device, with an external opening 30. External opening 30 is closed by a melt closure 90 that is formed from surrounding material by laser melting.

Figure 2:
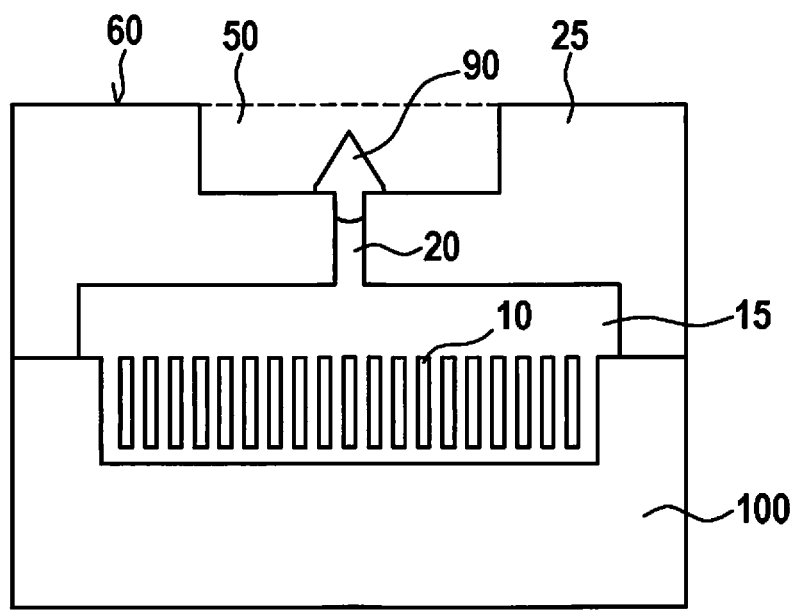
FIG. 2 shows a second micromechanical device having a deeper-seated laser melt closure from the existing art.

FIG. 2 shows a second micromechanical device from the existing art, having a deeper-seated laser melt closure. Differing from FIG. 1, here external opening 30 of access channel 20 is situated in a recess 50 in external main surface 60 of the micromechanical device. Likewise, as a result melt closure 90 is also situated in recess 50, and is thus disposed so as to be countersunk under external main surface 60 of the micromechanical device.

In previous realizations of the laser closure method, the access to the sensor cavern is closed either directly at the surface (FIG. 1) or in a wide laser cavern under the surface (FIG. 2). If the closure takes place directly at the surface, then further processing of the sensor wafer is possible only to a limited extent, because the closure is sensitive and can easily be damaged. However, if the closure is situated under the surface in a wide laser cavern, there is an increased risk that stress cracks will form that will ultimately cause leaks in the sensor cavern that is to be closed. This means that such a sensor element is no longer functional. Therefore, an optimization of the laser closure is necessary.

The cause of the occurrence of stress cracks, both in the case of closures at the surface and in deeper-seated laser caverns, lies in the laser closure method itself. In the region of the closure, the material is heated by the laser until it is liquid. The liquid closes the prepared access hole. During the subsequent hardening process, the previously liquid material expands. This is a known anomaly, comparable to that of water and ice. In addition, the temperature gradient between the already-hardened material and the surrounding, non-melted material causes tensile stresses that reduce the volume during the cooling process (without change of phase). The tensile stresses significantly exceed the pressure stresses during the changes of phase from liquid to solid. The resulting tensile stresses can cause cracks in the region of the previously melted material (FIG. 2).

According to the present invention, the micromechanical device has an access channel that has a collar at an external opening. The collar is raised in relation to a surrounding external surface of the MEMS. The collar can surround the access opening in annular fashion. On an inner side, the collar can be made flush with the access channel. The collar can be made of the same material that surrounds the access channel itself.

Figure 3A:
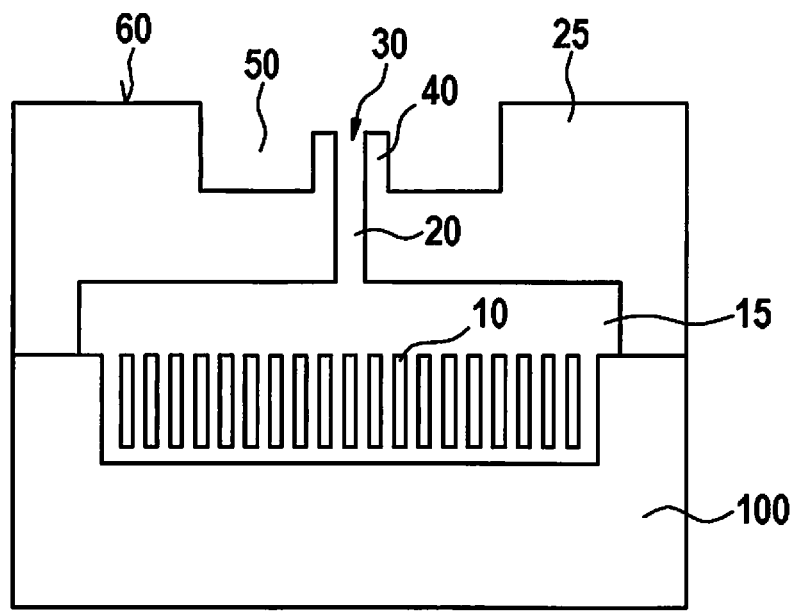
FIGS. 3 a and b show a first exemplary embodiment of a micromechanical device according to the present invention having a laser melt closure, before the closing.
Figure 3B:
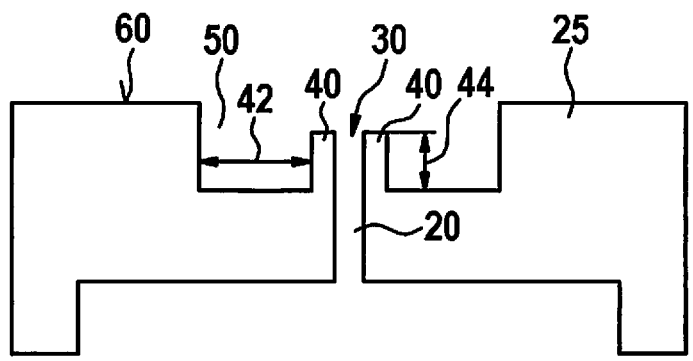

FIGS. 3 *a* and *b* show a first exemplary embodiment of a MEMS device according to the present invention having a laser melt closure, before the closing. In this configuration, a recess 50 is produced by laser. Inside this laser cavern, there is an access channel to the cavern volume of the micromechanical device. It is essential that the external opening of this access is itself surrounded by material that will later be used for the closure and has a topography that has a greater height than the floor of the wide laser cavern. For this purpose, access channel 20 has collar 40 at an external opening 30. Collar 40 is raised with a collar height 44 above a surrounding external surface of the micromechanical device. In this example, collar 40 in recess 50 in external main surface 60 is disposed in such a way that collar 40, with external opening 30 of access channel 20, is disposed so as to be countersunk in relation to external main surface 60. Here, collar 40 has a lateral collar distance 42 from an edge of recess 50.

Alternatively, the collar can also be situated directly on the external main surface of the micromechanical device, and can be raised over this external main surface.

During the laser closing method, the laser is directed onto the access hole and the immediately surrounding closure material in order to melt it. The melted material closes the access hole and hardens. The essential difference here from the previously known geometries is that stresses that occur during the cooling process can relax, because there is no lateral coupling of the laser closure, and as a result no stress cracks are produced. This is due to the decoupling from the surrounding environment of the material to be closed off. The result of the laser closing method with this new geometry is shown in FIG. 4.

Figure 4:
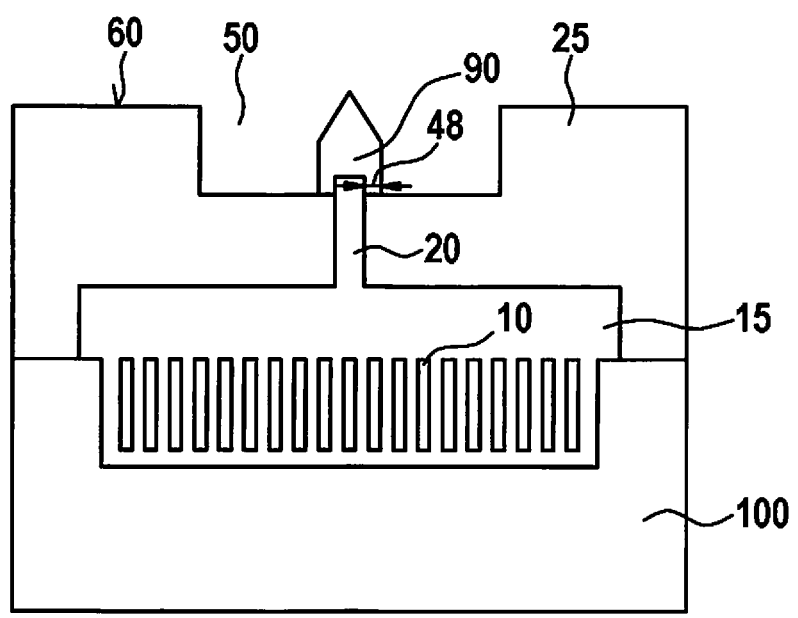
FIG. 4 shows a micromechanical device according to the present invention closed by laser melting, having a laser melt closure.
Figure 5A:
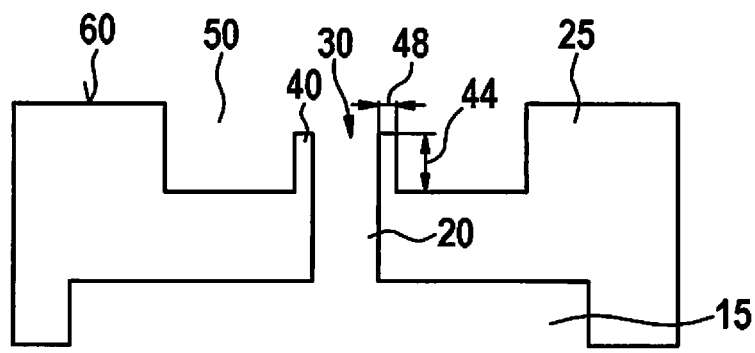
FIGS. 5 a and b show an exemplary embodiment of the micromechanical device according to the present invention having a laser melt closure, having a thin wall thickness of the directly surrounding material.
Figure 5B:
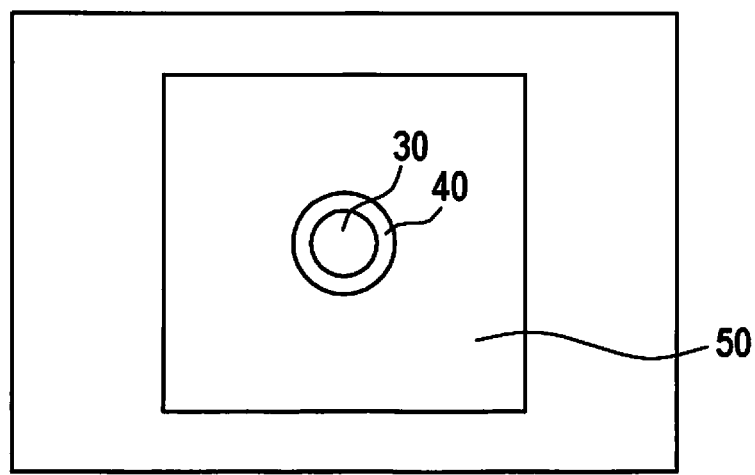
Figure 5C:
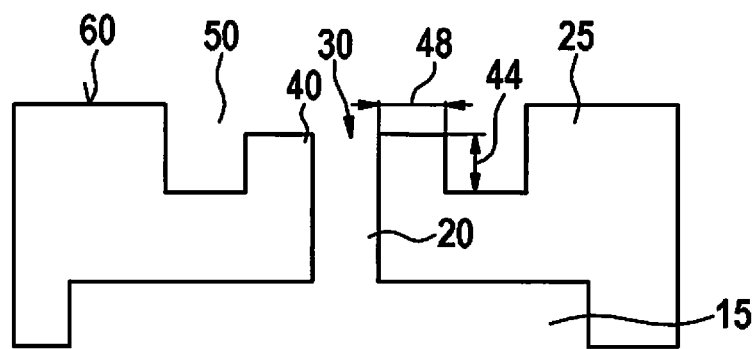
Figure 5D:
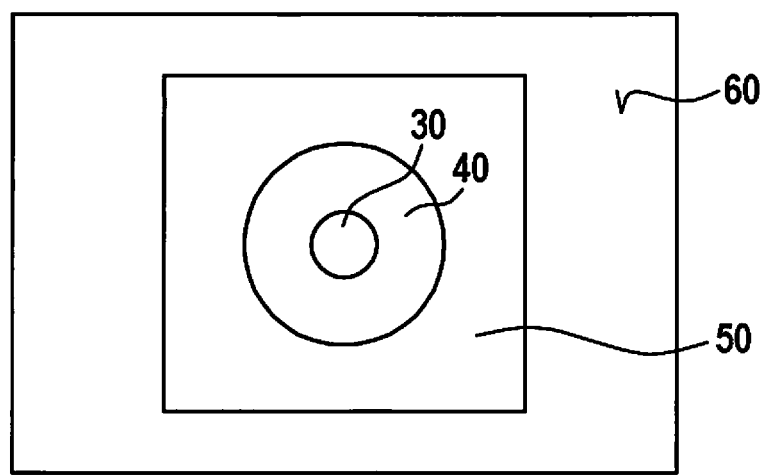
Figure 6A:
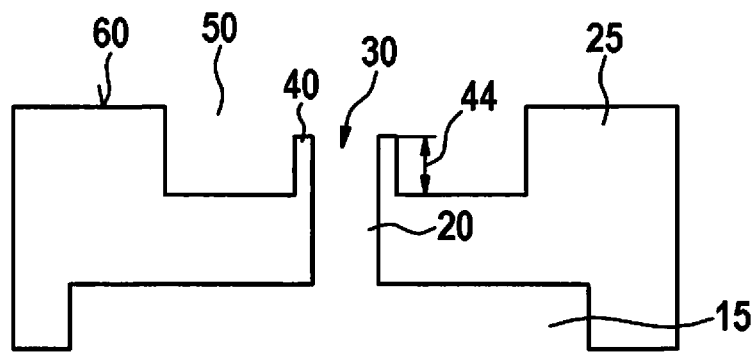
FIGS. 6 *a* and *b* show an exemplary embodiment of the micromechanical device according to the present invention having a laser melt closure, having a large hole diameter relative to the wall thickness of the directly surrounding material.
Figure 6B:
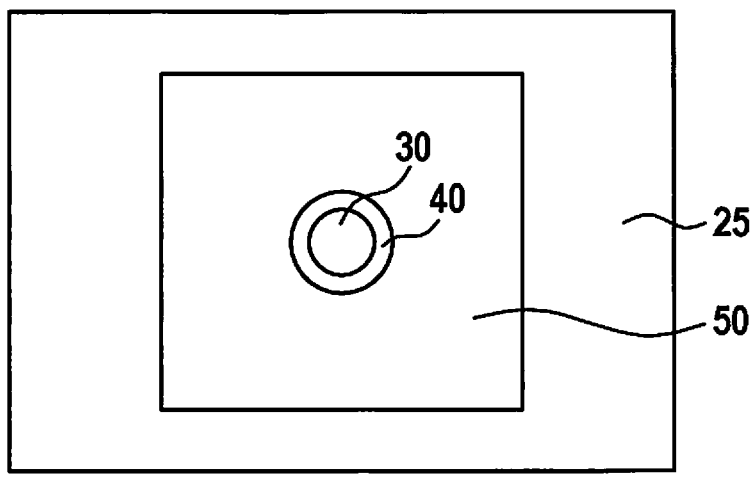
Figure 6C:
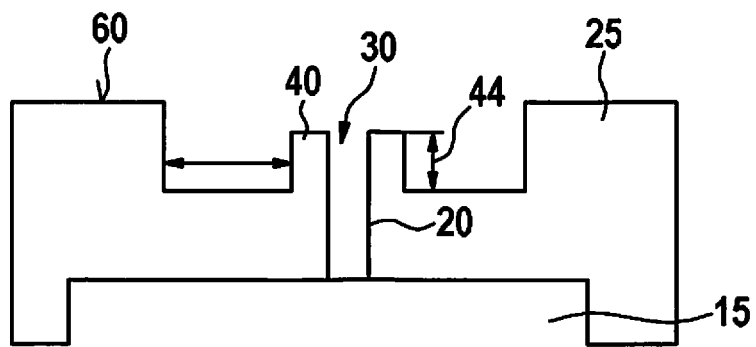
Figure 6D:
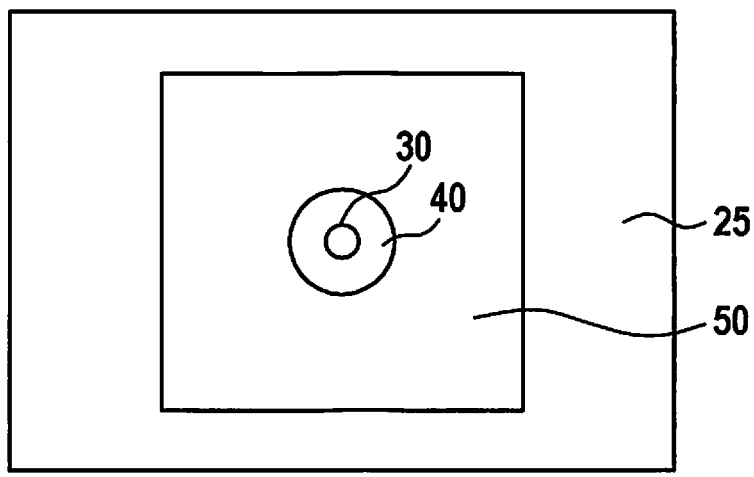
Figure 7A:
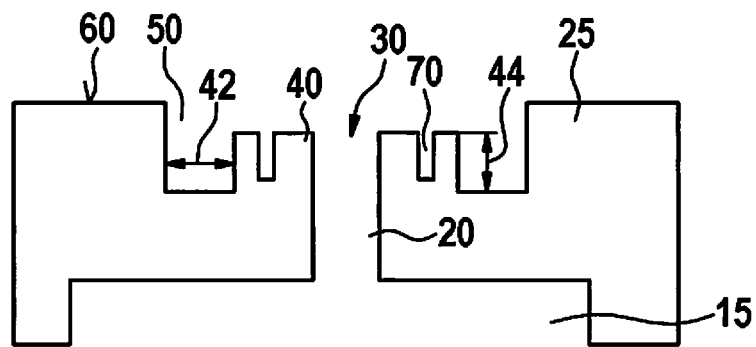
FIGS. 7 *a* and *b* show an exemplary embodiment of the micromechanical device according to the present invention having a laser melt closure, having an annular substructuring of the directly surrounding material.
Figure 7B:
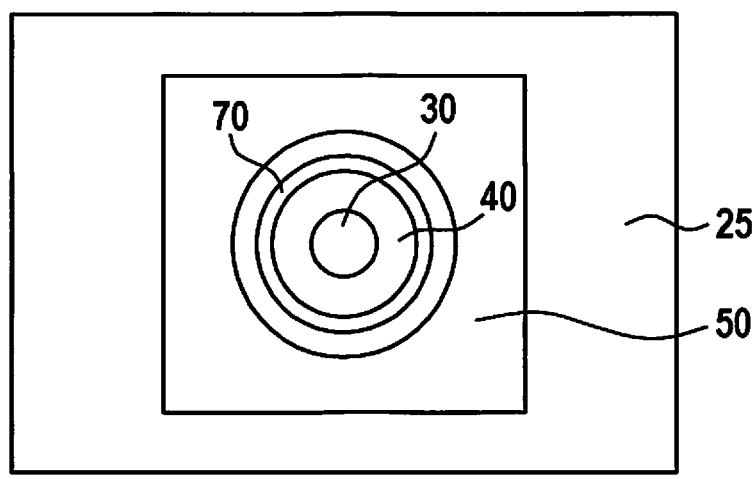
Figure 7C:
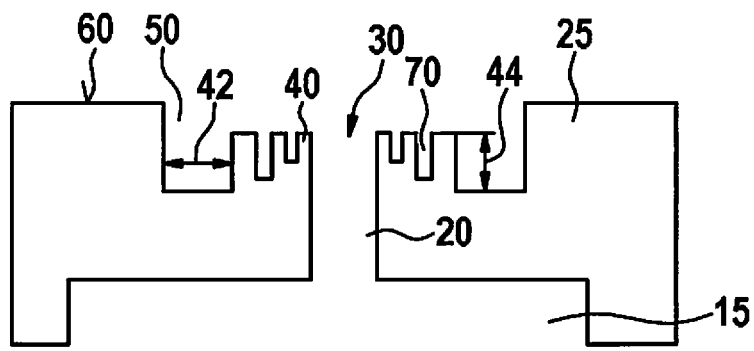
Figure 7D:
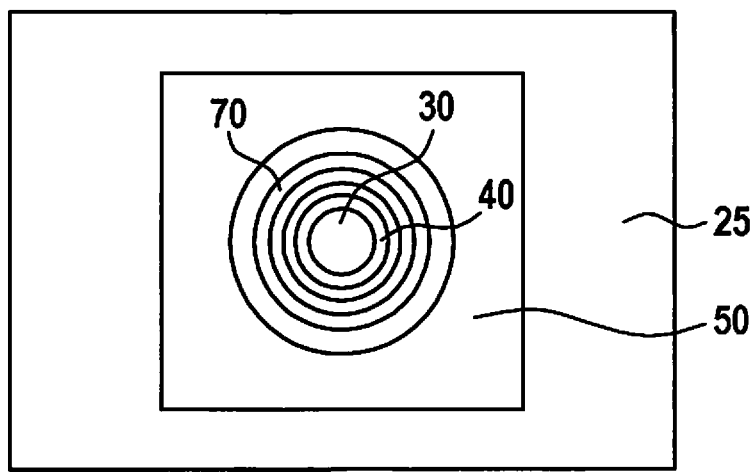
Figure 7E:
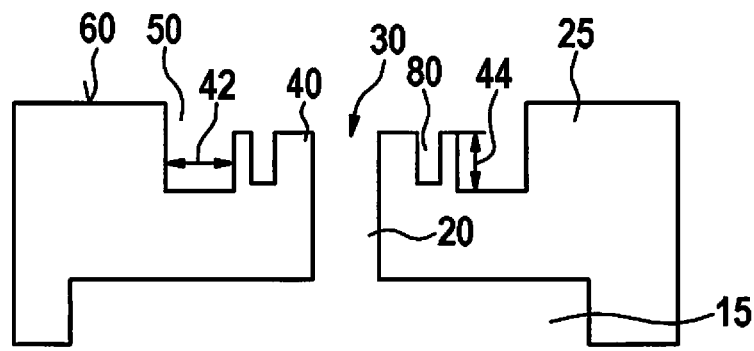
Figure 7F:
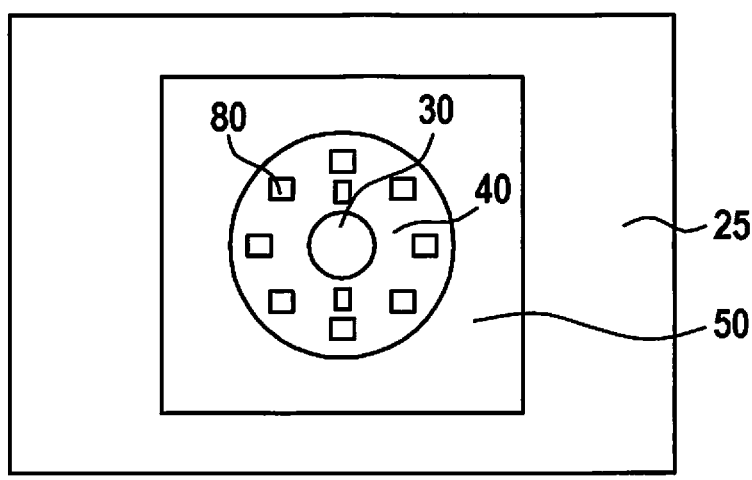

FIG. 4 shows a micromechanical device according to the present invention, closed by laser melting, having a laser melt closure. Differing from FIG. 3*a*, here an upper part of collar 40 has been melted by laser melting and forms a melt closure 90 that closes external opening 30 of access channel 20. Melt closure 90 is disposed over the remaining part of collar 40, and thus over the floor of recess 50. In order for enough material to be available for the melt, the collar must have an adequate wall thickness 48.

Alternatively, the entire collar 40 is melted by laser melting and its material forms the melt closure that closes the external opening of the access channel.

In addition, the geometry of the collar can be optimized by varying the relation of melted material to that of the hole to be closed. For the concrete realization of this, there are several approaches:

Optimization of the Wall Thickness of the Surrounding Hole Material According to FIGS. 5 *a-d:*

The relation between the surface of the hole and the surface of the directly surrounding material (seen in a top view) is modified by a modification of the wall thickness of the directly surrounding material. In this way, the quantity of melted material can be optimized to the hole diameter. FIGS. 5 *a* and *b* show an example of a collar having a relatively thin wall thickness 48, in cross-section and in a top view. FIGS. 5 *c* and *d* show an example of a collar having a relatively thick wall thickness 48, in cross-section and in a top view.

Hole Size Modification According to FIGS. 6 *a-d*

Another possibility for varying the relation between the hole diameter and the directly surrounding material is to modify the hole diameter. Examples of this are shown in FIGS. 6 *a-d*.

Structuring the Directly Surrounding Material According to FIGS. 7 *a-f*

Another possibility for modifying the relation between the melted material and the hole surface of the external opening is targeted substructuring of the directly surrounding material. In this way, the volume of the melted directly surrounding material can be varied, because there is a differing surface, having different heights, of the directly surrounding material. The substructuring can be made by concentric rings, squares, rectangles, or other geometrical shapes, as well as combinations thereof. In addition, the individual substructurings can have different heights. A selection of possible substructurings is shown in FIGS. 7 *a-f*. Technically particularly advantageous are the variants having completely circumferential rings, or also partly circumferential rings, i.e. annular trenches 70 (FIGS. 7 *a-d*). FIGS. 7 *a* and *b* show an example of an annular substructuring of the collar, in cross-section and in a top view. Shown is a collar 40 having a closed annular trench 70. FIGS. 7 *c* and *d* show an example of a plurality of annular substructurings of the collar having different depths, in cross-section and in a top view. Shown is a collar 40 having two concentrically disposed closed annular trenches 70. FIGS. 7 *e* and *f* show an example of a substructuring of the collar having blind holes, in cross-section and in a top view. Shown is a collar 40 having blind holes 80 having square cross-sections of different sizes. Cross-sections having other shapes and sizes are possible.

An essential parameter that describes an efficient relaxation of the stress is wall thickness 48 of collar 40 under closure 90 (see FIG. 4). The stiffness of a wall structure increases, to a first approximation, as the third power of the wall thickness. Through the segmenting of the wall into a plurality of wall regions having narrow wall thickness, in this way not only the relation between the melted material and the hole surface can be modified, but also, through a reduced stiffness of the wall structures, the capacity for relaxation of the overall system can be increased very efficiently.

Combination of the Substructuring Possibilities

For the optimization of the value of the melted material, the approaches of the above-described three measures can also be combined.

To produce this new geometry according to the present invention, the already-established methods of structuring using lithography and subsequent etching are used. Through suitable mask formation and exploitation of the ARDE effect, during dry etching an etching of the access channel and an additional structuring of the material directly surrounding the hole, i.e. of the collar, can take place in one etching step. This saves both process time and process costs. Thus, in this geometry according to the present invention there are no essential additional costs compared to the geometries previously used, but at the same time it becomes possible to optimize the laser closure and to eliminate the formation of cracks, in particular in deeper-seated laser caverns 50.

Alternatively, recess 50 can be produced by etching processes, instead of as a laser cavern.

Figure 8:
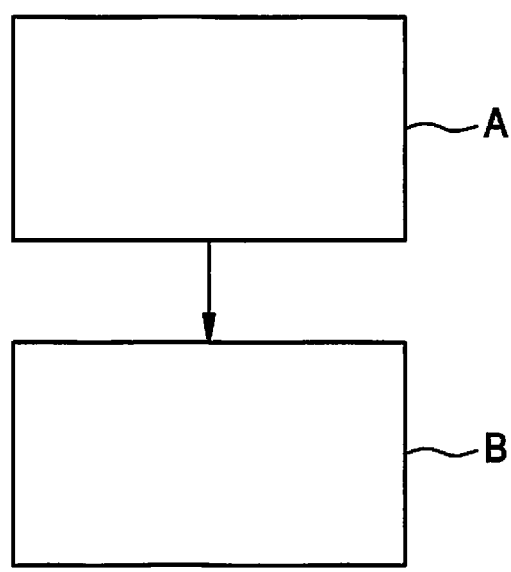
FIG. 8 schematically shows a method according to the present invention for closing off a micromechanical device using laser melting.

FIG. 8 schematically shows a method according to the present invention for closing off a MEMS by laser melting. The method according to the present invention for closing off a MEMS by laser melting contains at least the steps:

(A) providing a micromechanical device having an access channel 20 that has a collar 40 at an external opening 30.

(B) closing off external opening 30 of access channel 20 by laser irradiation of collar 40, collar 40 being at least partly melted, and external opening 30 being closed off by melt made of a material of the collar.

LIST OF REFERENCE NUMERALS

10 micromechanical functional element
15 cavern
20 access channel
25 cap
30 external opening
40 collar
42 lateral collar distance
44 collar height
48 wall thickness
50 recess
60 external main surface
70 annular trench
80 blind hole
90 melt closure
100 MEMS wafer

What is claimed is:

1. A method for closing off a micromechanical device using laser melting, comprising:
   (A) providing a micromechanical device having an access channel that has a collar at an external opening, the collar protruding from a surrounding outer surface; and
   (B) closing off the external opening of the access channel by laser irradiation of the collar, the collar being at least partly melted and the external opening being closed from above by melting down the collar in part and closing the remaining collar a surrounding external surface of the micromechanical device with melt made of a material of the collar.

2. The method for closing off a micromechanical device as recited in claim 1, wherein:
   the micromechanical device includes an external main surface,
   the collar is situated in a recess in the external main surface.

3. The method for closing off a micromechanical device as recited in claim 2, wherein the collar, with the external opening of the access channel, is disposed so as to be countersunk in relation to the external main surface.

4. The method for closing off a micromechanical device as recited in claim 1, wherein the collar includes a substructuring made by at least one trench that is disposed in annular fashion around the external opening and extends parallel to the access channel.

5. The method for closing off a micromechanical device as recited in claim 1, wherein the collar includes a substructuring made by blind holes that extend parallel to the access channel.

6. The method for closing off a micromechanical device as recited in claim 5, wherein the blind holes have a square cross-section.

7. The method for closing off a micromechanical device as recited in claim 2, wherein before step (A) at least one of the access channel, the recess, and the collar is produced at least partly by laser drilling.

8. The method for closing off a micromechanical device as recited in claim 4, wherein:
- the micromechanical device includes an external main surface,
- the collar is situated in a recess in the external main surface, and
- before step (A) at least one of the recess, the collar, and the substructuring is produced at least partly by dry etching.

9. The method for closing off a micromechanical device as recited in claim 5, wherein:
- the micromechanical device includes an external main surface,
- the collar is situated in a recess in the external main surface, and
- before step (A) at least one of the recess, the collar, and the substructuring is produced at least partly by dry etching.

* * * * *